(12) United States Patent
Her

(10) Patent No.: US 9,401,181 B2
(45) Date of Patent: Jul. 26, 2016

(54) ELECTRONIC DEVICE WITH LOCKING STRUCTURE FOR STORAGE DEVICE

(71) Applicant: HON HAI PRECISION INDUSTRY CO., LTD., New Taipei (TW)

(72) Inventor: Shyue-Dar Her, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/512,889

(22) Filed: Oct. 13, 2014

(65) Prior Publication Data

US 2015/0245528 A1 Aug. 27, 2015

(30) Foreign Application Priority Data

Feb. 26, 2014 (TW) .............................. 103106452 A

(51) Int. Cl.
*H05K 7/14* (2006.01)
*G11B 33/12* (2006.01)
*G06F 1/18* (2006.01)
*H05K 5/04* (2006.01)

(52) U.S. Cl.
CPC .............. *G11B 33/124* (2013.01); *G06F 1/187* (2013.01); *H05K 7/1401* (2013.01); *H05K 5/04* (2013.01)

(58) Field of Classification Search
CPC ....... G06F 1/181; G06F 1/187; G06F 1/1624; G06F 1/1613; G06F 1/1622; G06F 1/169; G06F 1/183; H05K 5/0221; H05K 7/1489; H05K 7/1408; H05K 9/0016; H05K 5/0208; H05K 7/12; H05K 7/1401; H05K 5/04; H05K 7/1487; H05K 7/20727; H05K 5/0286; H05K 7/1461; G11B 33/124

USPC ............ 361/679.33–679.39, 679.55–679.58, 361/724–727; 312/223.1–223.2
See application file for complete search history.

(56) References Cited

U.S. PATENT DOCUMENTS

| | | | |
|---|---|---|---|
| 9,030,819 B2 * | 5/2015 | He | H05K 7/14 248/222.51 |
| 2008/0089021 A1 * | 4/2008 | Deng | G06F 1/187 361/679.39 |

FOREIGN PATENT DOCUMENTS

| | | |
|---|---|---|
| CN | 2327047 Y | 6/1999 |
| CN | 2485754 Y | 4/2002 |
| CN | 201107701 Y | 8/2008 |
| TW | M258391 | 3/2005 |
| TW | 201318532 A | 5/2013 |
| TW | 201345381 A | 11/2013 |

* cited by examiner

*Primary Examiner* — Anthony Haughton
*Assistant Examiner* — Ingrid Wright
(74) *Attorney, Agent, or Firm* — ScienBiziP, P.C.

(57) ABSTRACT

A locking structure for detachably mounting a storage device to a casing of an electronic device includes a carrier fixed in the casing which defines a plurality of slots. a fixing member is also included, and an enclosure defining a plurality of positioning shafts corresponding to the slots which are configured to hold the storage device. A rotating frame is connected with the enclosure and a handle is connected with the rotating frame, the rotating frame including a hook engaged with the fixing member. When the handle is pulled to disengage the shafts from the slots and detach the hook from the fixing member, the storage device can be removed from the electronic device.

10 Claims, 4 Drawing Sheets

ELECTRONIC DEVICE WITH LOCKING STRUCTURE FOR STORAGE DEVICE

FIELD

The subject matter herein generally relates to structures for electronic devices.

BACKGROUND

Storages devices, such as a hard disk, are mounted to computers by screws. Thus, disassembly of the screws by a screwdriver is needed before taking the storage device out of the computer.

BRIEF DESCRIPTION OF THE DRAWINGS

Implementations of the present technology will now be described, by way of example only, with reference to the attached figures.

DETAILED DESCRIPTION

Figure 1:
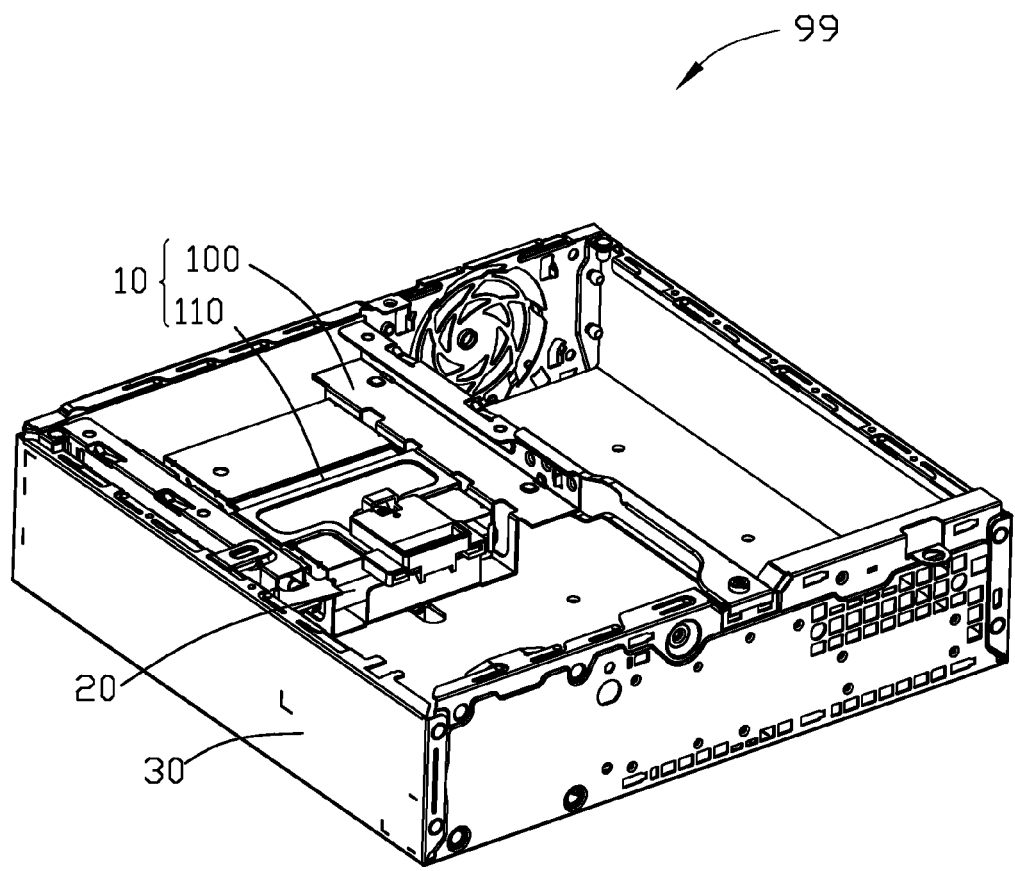
FIG. 1 is an isometric view of an embodiment of a locking structure for a storage device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising," when utilized, means "including, but not necessarily limited to"; it specifically indicates open-ended inclusion or membership in the so-described combination, group, series and the like.

The following disclosure describes an electronic device with a locking structure for attachment of a storage device.

FIG. 1 illustrates that an electronic device 99 includes a locking structure 10, a storage device 20, and a casing 30. The locking structure 10 is configured to mount the storage device 20 in the casing 30. The storage device 20 can be a hard disk.

The locking structure 10 includes a carrier 100 mounted to the casing 30, and a locking module 110 located on the carrier 100.

Figure 2:
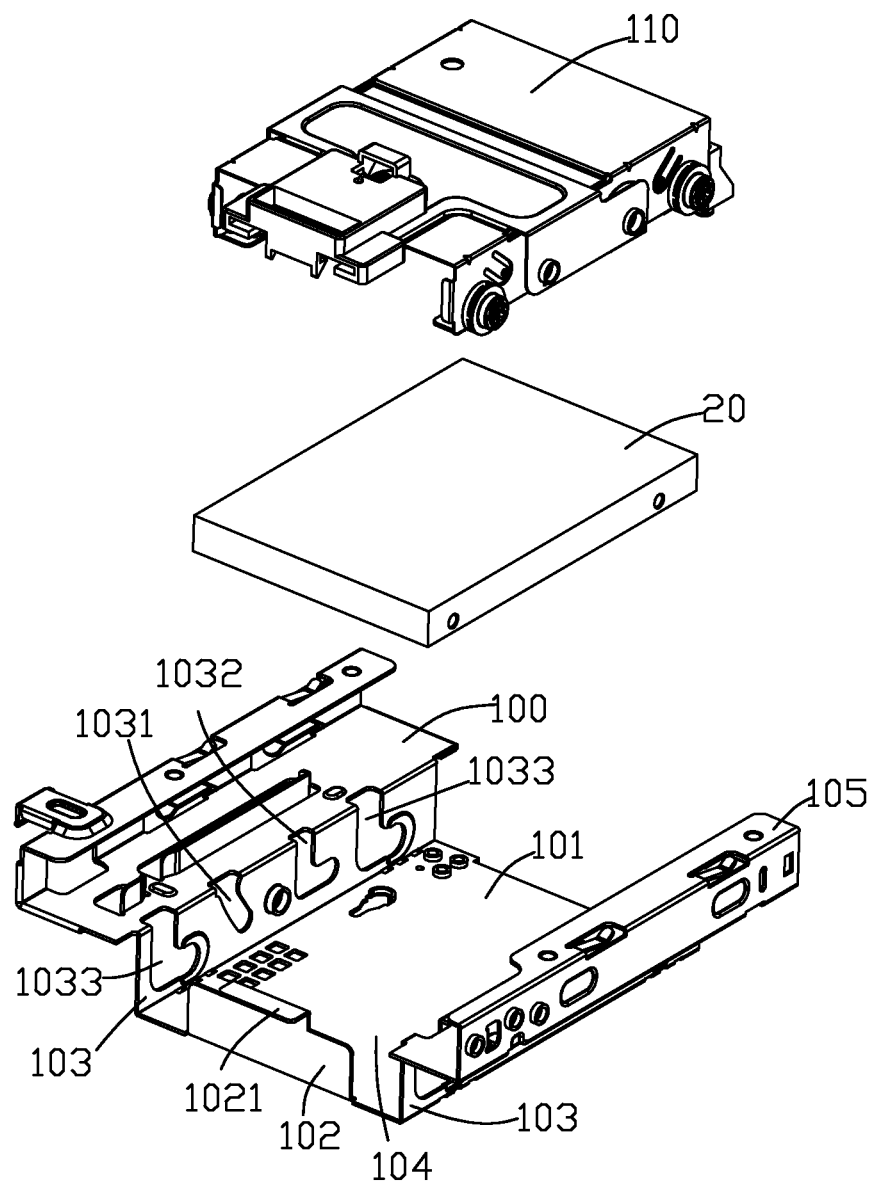
FIG. 2 is an exploded isometric view of the locking structure of FIG. 1.

FIG. 2 illustrates that the carrier 100 includes a bottom wall 101, a fixing member 102, and a pair of first sidewalls 103. The fixing member 102 and the first sidewalls 103 extend vertically from a periphery of the bottom wall 101. The fixing member 102 is located between the sidewalls 103 and cooperates with the bottom wall 101 to form a first receiving space 104. The locking module 110 is received in the first receiving space 104.

The fixing member 102 includes a latching portion 1021. The latching portion 1021 protrudes from the fixing member 102 away from the receiving space 104. Each of the first sidewalls 103 defines a first slot 1031, a second slot 1032, and a third slot 1033. The first slot 1031 and the third slot 1033 are L-shaped. The carrier 100 further includes a connecting part 105 connecting to the first sidewall 103. The carrier 100 is secured to the casing 30 by the connecting part 105.

Figure 3:
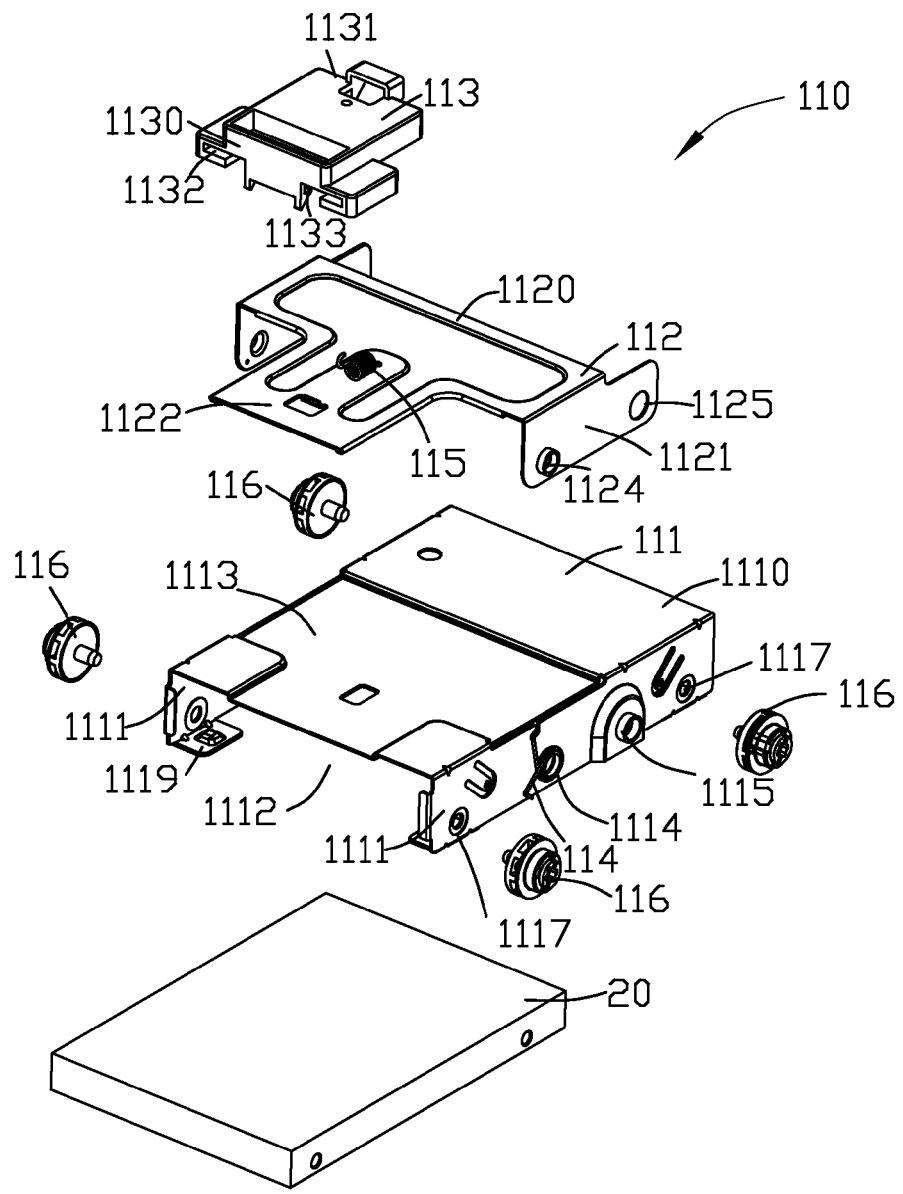
FIG. 3 is an exploded isometric view of a locking module of the locking structure of FIG. 2.
Figure 4:
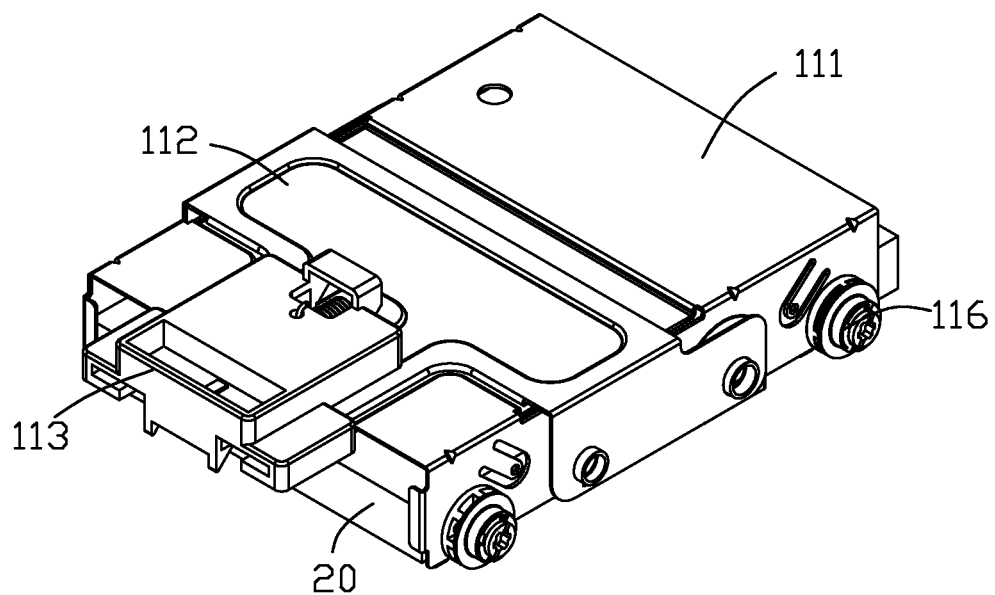
FIG. 4 is an isometric view of the locking module of FIG. 3.

FIG. 3 and FIG. 4 illustrate that the locking module 110 includes an enclosure 111, a rotating frame 112, a handle 113, a torsion spring 114, a drag spring 115 and a plurality of screws 116.

The enclosure 111 includes a roof 1110, and a pair of second sidewalls 1111. The second sidewalls 1111 extend vertically from opposite peripheries of the roof 1110, and cooperate with the roof 1110 to define a second receiving space 1112. The roof 1110 defines a concave region 1113, and the rotating frame 112 is positioned at the concave region 1113. The concave region 1113 is in a shape of a "T" and is recessed into the roof 1110. Each of the second sidewalls 1111 includes a first positioning shaft 1114, and a second positioning shaft 1115 and a pair of fixing holes 1117 is defined in each second sidewall 1111.

The fixing holes 1117 are defined at opposite ends of the second walls 1111. The first positioning shaft 1114 and the second positioning shaft 1115 protrude from the second sidewalls 1111 and are located between the fixing holes 1117. The second sidewall 103 further includes a plurality of supporting pieces 1119. The supporting pieces 1119 extend toward the second receiving space 1112 and are perpendicular to the second sidewall 103.

The rotating frame 112 includes a main body 1120, a fixing part 1121, and a handle-fixing part 1122. The fixing part 1121 perpendicularly extends from opposite edges of the main body 1120. The hand-fixing part 1122 extends from another edge of the main body 1120. The fixing part 1121 defines a first through hole 1124 and a second through hole 1125. The first positioning shaft 1114 passes through the first through hole 1124, and the second positioning shaft 1114 passes through the second through hole 1125, to fix the rotating frame 112 on the enclosure 111.

The torsion spring 114 is fixed on the first positioning shaft 1114, an end of the torsion spring 114 is connected to the enclosure 111, and another end of the torsion spring 114 is connected to the rotating frame 112.

The handle 113 includes a first end 1130 and a second end 1131. The first end 1130 defines a pair of sliding slots 1132, a hook 1133 and an operation portion 1134. The pair of sliding slots 1132 are located at opposite sides of the first end 1130, and the hand-fixing part 1122 is fixed in the sliding slots 1132. The hook 1133 is located between the pair of sliding slots 1132.

The drag spring 115 is set at the second end 1131 of the handle 113. An end of the drag spring 115 is connected to the second end 1131, and another end of the drag spring 115 is connected to the rotating frame 112.

In use, the screws 116 are inserted through the fixing holes 1117 to fix the storage device 20 in the second receiving space 1112. The first positioning shaft 1114 is slid into the first slot 1031. The second positioning shaft 1115 is slid into the second slot 1032. The screws 116 enter the third slots 1033, and the hook 1133 is engaged with the latching portion 1021 to lock the storage device 20 in the casing 30.

When the storage device 20 is to be moved from the casing 30, the handle 113 is pulled to make the hook 1133 disengage from the latching portion 1021, to release the locking module 110. The first positioning shaft 1114 is slid out of the first slot 1031, the second positioning shaft 1115 is slid out of the second slot 1032, and the screws 116 lift out of the third slots 1033. Then, the storage device 20 can be taken out from the casing 30.

The embodiments shown and described above are only examples. Many details are often found in the art such as the other features of an electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A locking structure for detachably mounting a storage device to an electronic device, the electronic device comprising a casing, the locking structure comprising:
    a carrier fixed to the casing and comprising a pair of first sidewalls facing each other, and a fixing member located between the first sidewalls, the fixing member and the first sidewalls forming a first receiving space, each of the first sidewalls defining a slot;
    an enclosure to hold the storage device, the enclosure detachably received in the first receiving space, the enclosure comprising a plurality of positioning shafts corresponding to the slots, wherein the enclosure further comprises a roof, and a pair of second sidewalls, the second sidewalls extend from opposite peripheries of the roof and face each other, the positioning shafts protrude from the second sidewalls;
    a rotating frame positioned on the enclosure; and
    a handle comprising a first end, a second end opposite to the first end, and a hook extended from the first end, the hook being engaged with the fixing member, the second end of the handle being fixed to the rotating frame;
    wherein the plurality of positioning shafts engage with the slots, and the hook engages the fixing member to secure the storage device to the electronic device, and when the handle is pulled to disengage the shafts from the slots and detach the hook from the fixing member, the storage device can be removed from the electronic device.

2. The locking structure for storage device of claim 1, wherein the roof defines a concave region recessed from a surface opposite to the storage device, the rotating frame is located in the concave region.

3. The locking structure for storage device of claim 2, wherein the rotating frame comprises a main body, a pair of fixing parts, and a handle-fixing part, the fixing parts extend from opposite edges of the main body, the hand-fixing part extends from another edge of the main body, the fixing parts are secured on the second sidewalls, the hand-fixing part is connected with the handle.

4. The locking structure for storage device of claim 3, wherein the handle defines a sliding slot, the fixing part is engaged with the sliding slot, the locking structure further comprises a spring connected with the handle and the rotating frame.

5. The locking structure for storage device of claim 1, wherein the slots are L-shaped.

6. An electronic device, comprising:
    a casing;
    a storage device; and
    a locking structure for detachably mounting the storage device to the casing, the locking structure comprising:
        a carrier fixed to the casing and comprising a pair of first sidewalls facing each other, and a fixing member located between the first sidewalls, the fixing member and the first sidewalls forming a first receiving space, each of the first sidewalls defining a slot;
        an enclosure to hold the storage device, the enclosure detachably received in the first receiving space, the enclosure comprising a plurality of positioning shafts corresponding to the slots, wherein the enclosure further comprises a roof, and a pair of second sidewalls, the second sidewalls extend from opposite peripheries of the roof and face each other, the positioning shafts protrude from the second sidewalls;
        a rotating frame positioned on the enclosure; and
        a handle comprising a first end, a second end opposite to the first end, and a hook extended from the first end, the hook being engaged with the fixing member, the second end of the handle being fixed to the rotating frame;
    wherein the plurality of positioning shafts engage with the slots, and the hook engages the fixing member to secure the storage device to the electronic device, and when the handle is pulled to disengage the shafts from the slots and detach the hook from the fixing member, the storage device can be removed from the electronic device.

7. The electronic device of claim 6, wherein the roof defines a concave region recessed from a surface opposite to the storage device, the rotating frame is located in the concave region.

8. The electronic device of claim 7, wherein the handle defines a sliding slot, the fixing part is engaged with the sliding slot, the locking structure further comprises a spring connected with the handle and the rotating frame.

9. The electronic device of claim 6, wherein the rotating frame comprises a main body, a pair of fixing parts, and a handle-fixing part, the fixing parts extend from opposite edges of the main body, the hand-fixing part extends from another edge of the main body, the fixing parts are secured on the second sidewalls, the hand-fixing part is connected with the handle.

10. The electronic device of claim 6, wherein the slots are L-shaped.

* * * * *